United States Patent [19]
Turek et al.

[11] Patent Number: 5,891,527
[45] Date of Patent: *Apr. 6, 1999

[54] PRINTED CIRCUIT BOARD PROCESS USING PLASMA SPRAYING OF CONDUCTIVE METAL

[75] Inventors: Joe Turek; Dan Gosselin; Nanu Vahora, all of Bensenville, Ill.

[73] Assignee: M/Wave, Bensenville, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 720,817

[22] Filed: Oct. 2, 1996

Related U.S. Application Data

[63] Continuation of Ser. No. 552,585, Nov. 3, 1995, abandoned.

[60] Provisional application No. 60/003,814 Sep. 15, 1995.

[51] Int. Cl.⁶ .................................................. C23C 4/02

[52] U.S. Cl. .............................. 427/448; 427/455; 427/96
[58] Field of Search ................................ 427/448, 96, 97, 427/455

[56] References Cited

U.S. PATENT DOCUMENTS

| | | | |
|---|---|---|---|
| 2,599,710 | 6/1952 | Hathaway | 427/448 |
| 4,678,738 | 7/1987 | Shimizu et al. | 427/448 |
| 4,921,721 | 5/1990 | Matsui et al. | 427/309 |
| 4,940,623 | 7/1990 | Bosna et al. | 427/455 |
| 5,391,404 | 2/1995 | Lee et al. | 427/309 |

*Primary Examiner*—Katherine A. Bareford
*Attorney, Agent, or Firm*—Leydig, Voit & Mayer Ltd.

[57] ABSTRACT

A printed circuit board is formed by preparing at least one surface of a substrate with a pattern including selected areas for receiving metal, and non-selected areas to which metal will not adhere; the surface is then plasma sprayed with metal to coat the selected areas.

2 Claims, 2 Drawing Sheets

PRINTED CIRCUIT BOARD PROCESS USING PLASMA SPRAYING OF CONDUCTIVE METAL

This is a continuation of application Ser. No. 08/552,585, filed on Nov. 3, 1995, now abandoned.

CROSS-REFERENCE TO RELATED APPLICATIONS

This application is based on a United States provisional patent application; Ser. No. 60/003814 filed Sep. 15, 1995, the benefit of which is hereby claimed.

FIELD OF THE INVENTION

The invention relates generally to printed circuit boards, and more particularly to a novel printed circuit board using plasma spraying technology to form the board.

BACKGROUND OF THE INVENTION

The use of printed circuit boards for a wide variety of applications is well known. Despite this variety, printed circuit boards share the common features of requiring formation of a metalization pattern on a substrate in a desired configuration. A common conventional technique for forming the metalization pattern on a surface (or surfaces) of a printed circuit board begins with a laminate comprised of a typically dielectric substrate clad with the metal, typically copper, on one or both sides. The metal cladding layer is applied by means of electroplating. Electroplating, however, requires use of chemicals which generate hazardous waste, including, for example spent sulfuric acid, drag out water (including copper sulfate and sulfuric acid), tin fluoboric, lead fluoboric and fluoboric acid, all of which must be properly disposed of. Following plating of the metal layer or layers, a subtractive process is used to remove the metal from the areas of the circuit board where it is not desired.

Many of these subtractive processes require use of a highly controlled wet chemistry process which may generate large quantities of undesirable hazardous waste, and which add a multiplicity of process steps to the formation of a circuit board. For the formation of a typical one-sided circuit board according to such a process, a masking step is first performed wherein a dry film photo-imagable resist is applied to the metal clad surface, typically by hot roll lamination. The resist is then imaged by placing a mylar imaging sheet (sometimes referred to as a "photomask") over the film, the imaging sheet having an image of the desired metalization patterned formed therein. The resist, as covered by the imaging sheet, is then exposed to UV light. After the mask is removed, a developer solution (illustratively 1% KOH or $K_2C_3O$) is applied to the surface to dissolve and remove the resist in the areas of the circuit board where metalization is not desired. After developing, then, the surface of the circuit board includes resist covering the areas were metal is desired and the metal being exposed in the areas where metalization is not desired. The masked circuit board is then subjected to an etch step, wherein an etchant attacks and removes the copper or other metal in the unmasked areas. In an alternative process, the resist is patterned such that the copper is exposed in the areas where metalization is desired. The board is then solder plated, but only the exposed copper areas receive solder, since the resist prevents plating elsewhere. The resist is then removed by use of a solvent mixture including aliphatic amine and glycol ether in an inorganic base. The board is then placed in an etchant which etches the bare, unwanted copper, but not the solder plated copper. Regardless of which of these processes is used, a typical etchant for etching the exposed copper is a copper ammoniacal chloride solution (if the metal layer is copper). If a process was used in which resist remains on the board, the resist is then stripped from the remaining copper on the circuit board, using the solvent mixture described above. The typical mask and etch process for forming a conventional circuit board thus includes numerous process steps many of which generate hazardous waste which must be collected for proper disposal or reprocessing, thus adding expense to the process. Furthermore, in forming a double-sided circuit board, additional process steps, and thus a higher volume of chemicals, are required. In addition, the etching process often leads to undercutting of the foils forming the metalization pattern. Despite the fact that either resist or solder covers the desired foil, the etchant may still be able to partially attack the copper below.

A related subtractive method for forming printed circuit boards is so-called thin film processing. According to this process, an extremely thin coating (as opposed to the thick electroplated coating of the previous example) of copper or other metal is deposited to cover the entire surface of the dielectric substrate. Thin film processing typically uses either a sputtering process or vacuum deposition for depositing this extremely thin layer. Thus, the metal is deposited onto the substrate without need for plating solutions. However, once the thin layer of metal is in place on the substrate, standard masking and etching must still be performed in order to pattern the resulting metal layer, leading to the hazardous waste and undercutting problems previously mentioned. Moreover, because of the extremely thin coating applied to the substrate by the sputtering or vacuum deposition process, the board resulting from the mask and etch process must then be plated-up so that the metalization will be of sufficient thickness to achieve its desired function of conducting electricity with low resistivity. Such plating-up of a patterned circuit board may be performed either by electroplating (the preferred process), or by electroless deposition. In either case, the plating step that was omitted from the beginning of the process must be performed at the end of the process. Accordingly, thin film processing does not offer significant reductions either in process steps or in the generation of hazardous waste.

Other non-substractive techniques for forming printed circuit boards are also known. According to such techniques, wet chemistry is not required for masking and etching of an already-plated surface. Rather, thick conductive films are applied in the metalization pattern on the surface by means of silk screening. The conductive paths thus deposited by the thick film silk screen are then developed using either a high temperature process or a low temperature process. In the high temperature process, the thick film is formed of either silver palladium, gold platinum or gold palladium suspended in a butyl carbitol acetate solvent and including a binder of cellulose acetate. In the high temperature process, the thick film is exposed to a high temperature for the purpose for burning out the cellulose acetate binder that was used for placing the metal. Burn out of the binder, however, leaves voids in the conductive thick film. Accordingly, the metal remaining after the burn out process must be subjected to a sintering process to eliminate these voids. Because of the high temperature of both burn out and sintering, the high temperature process is limited in that it can be used only on dielectric substrates that can withstand the very high temperatures. Accordingly, the high temperature process is typically limited to ceramic substrates.

In the low temperature thick film process, the thick film is also applied to the substrate surface by means of silk screening. However, the thick film in this process includes a solvent of butyl carbitol acetate and naphtha including a thick film binder of phenolic resin and ether cellulose. In this process, the binder remains intact with the conductive medium and is not burned out as in the high temperature version. Thus, the low temperature version may be used on a wider variety of substrates. However, the low temperature thick film, primarily because of the continued presence of the binder, does not have the low resistivity typically desired in metal foils used for circuit boards. The range of applications for low temperature thick film circuit boards is thus limited by this low resistivity. While the two thick film processes described may generate less hazardous waste and include less process steps than the subtractive techniques, they are limited either by temperature considerations, or by undesirable electrical characteristics.

SUMMARY OF THE INVENTION

It is thus a primary aim of the invention to provide an improved method for forming printed circuit boards.

In accordance with that aim, it is a primary object of the invention to reduce the hazardous chemistry associated with typical circuit board fabrication processes.

A further object of the invention is to reduce the number of process steps required for forming a printed circuit board.

It is a further object of the invention to provide a circuit board fabrication technique that may be successfully applied to variety of substrates without temperature limitations.

In accordance with these and other objects of the invention, there is provided a method for forming a circuit board which, in its broadest sense, comprises preparing at least one surface of a substrate with a pattern including selected areas for receiving metal and non-selected areas to which metal will not adhere, followed by plasma spraying the at least one surface with metal to coat the selected areas. Since the selected areas are those where a metalization pattern is desired, a fully patterned circuit board results. Deposition of a circuit board metalization pattern by this technique thus eliminates any need for uniformly plating a substrate, and then performing a subtractive process including masking and etching that substrate to form the pattern. This results in a simpler, more efficient process, and in a significant reduction in the hazardous waste typically associated with mask and etch processing. The method according to the invention also advantageously makes use of plasma spraying of the metal onto the surface of the substrate. Different portions of a substrate surface either receive or resist coating by plasma-sprayed metal, and the use of the plasma spraying technique provides easy patterning of conductive lines that also have desirable resistivity properties. At the same time, the plasma spraying technique does not subject the substrate to undue temperatures during deposition thus allowing the method of the invention to be applied to a variety of substrate materials.

According to a preferred embodiment of this broad method, at least one surface of a substrate is conditioned for receiving an adhesion-resistant material and metal. Such conditioning of the surface to receive an adhesion-resistant material metal may be carried out either by a chemical etch, grit-blasting, or gas plasma treatment of the surface. Following this surface conditioning step, a layer of material is applied to the at least one surface. This material resists the adhesion of flame sprayed metal, The adhesion-resistant material is then patterned to expose the areas of the circuit board to be coated with metal. In the case where the adhesion-resistant material is a photo-imagable resist, this patterning step is carried out by selectively exposing portions of the adhesion-resistant material layer to radiation, and subsequently developing the layer. Following patterning of the adhesion-resistant material, the at least one surface is plasma sprayed with metal to coat the exposed areas of the at least one surface. The areas covered with the adhesion-resistant material are not coated because of the physical properties of the material. As a result of this process, a desired metalization pattern may be deposited on the surface of the substrate with a minimum of processing steps, without generating significant chemical waste, and without undue substrate heating.

The invention also includes a method for forming plated through holes. Openings, including at least one sidewall angled from the vertical, are formed in a substrate. The interior surfaces of the openings are then conditioned for receiving metal. Metal is then plasma sprayed at the substrate. The conditioning of the sidewalls for receiving metal, and the plasma spraying of the metal at the substrate may be done simultaneously with similar process steps in the circuit board formation technique according to the invention. By virtue of the angled sidewalls of the openings, and their conditioning for receiving metal, the sidewalls are coated with metal to simply form plated through holes with a minimum of processing, and without generating undue waste.

BRIEF DESCRIPTION OF THE DRAWINGS

The invention will be described in reference to certain preferred embodiments as shown in the attached drawings wherein.

DESCRIPTION OF THE PREFERRED EMBODIMENTS

While the invention will be described with reference to the preferred embodiments, it will be obvious to those of ordinary skill in the art that variations of these preferred embodiments may be used and it is intended that the invention may be practiced otherwise than as specifically described herein. Accordingly this invention includes all modifications and equivalents encompassed within the spirit and scope of the invention as defined by the appended claims.

Figure 1:
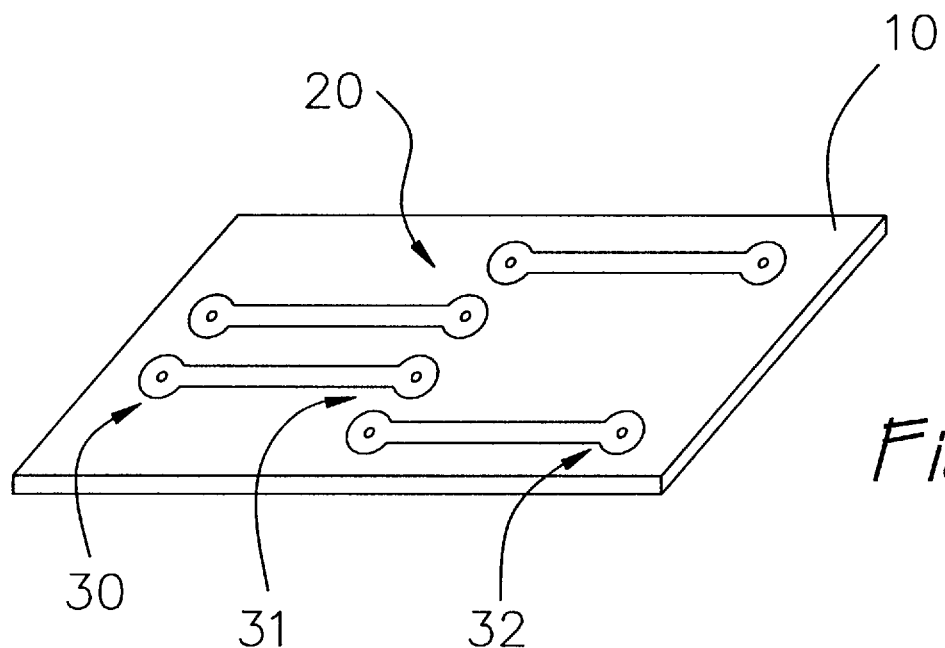
FIG. 1 is a perspective view of a simplified printed circuit board formed according to the method of the invention.

A printed circuit formed according to the method of the present invention is shown in FIG. 1. As will be appreciated by one skilled in the art, the circuit board of FIG. 1 is highly simplified and includes a metalization pattern designated generally by the reference numeral 20 extending between the series of holes 30, 31 and 32 formed in the substrate 10 upon which the printed circuit is formed. Holes 30, 31 and 32 will illustratively receive the leads of electronic components or wires soldered to the circuit board. The invention, however, is not limited to formation of circuit boards like that shown in FIG. 1. Rather, the invention may be applied to a variety of circuit boards including double-sided boards, multiple layer boards and surface mount boards. Further, the invention may be used to achieve metallization patterns in a variety of configurations, and of various line densities. At present, the inventive method has successfully been used to generate densities as small as 2 mil linewidths with 2 mil line spacing.

According to a significant aspect of the invention, the metalization pattern 20 is formed by adding the constituent metal directly to the substrate in the desired metalization pattern by means of a plasma spray technique. Accordingly, no wet chemical process for either originally plating the metal to the substrate surface, nor for masking and etching metal from the surface to remove unwanted metal is required. This results in significantly reduced hazardous chemical waste in the processing of circuit boards. Further, less steps may be used in forming the boards.

The simplified process for forming the circuit boards according to the invention was made possible by utilization of the phenomena that plasma sprayed metals, such as copper, will not effectively adhere to smooth or glossy surfaces or to surfaces having a low surface energy, such as PTFE. This effect is advantageously used, then, in forming circuit boards, by preparing the substrate with a pattern including selected areas for receiving metal, and non-selected areas to which metal will not adhere. According to one embodiment of the invention, this preparation of the substrate with a pattern is accomplished by using a material that resists adhesion of plasma sprayed metal to mask off the areas where a metalization pattern is not desired prior to the plasma spray step. Such material will be referred to herein as a "adhesion-resistant material", and that term is intended to encompass a variety of materials that may be applied to one or both surfaces of a circuit board substrate to present a smooth or glossy surface to which plasma sprayed metal will not stick. Preferably, the adhesion-resistant material is also patternable so that the entire surface of the substrate may be covered with the adhesion-resistant material, and then portions of this coating can be removed from the substrate surface, prior to the plasma spray step, to expose the areas of the substrate where metalization patterning is desired.

Figure 2:
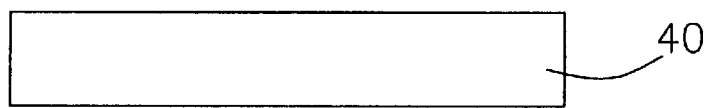
FIGS. 2, 3, 4, 5, 6, and 7 are sectional representations of a circuit board showing the circuit board at various stages during performance of the method according to the invention.
Figure 3:
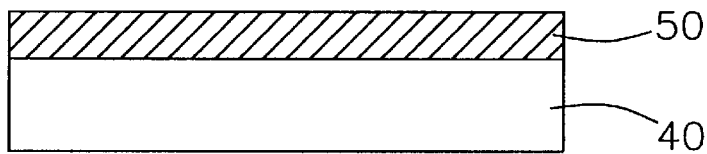

According to the preferred embodiment of the invention, the adhesion-resistant material is a photo imagable resist which may either be in liquid form, and applied to the substrate by silk screening, or which may be in dry film form which can be hot roll laminated to either one or both sides of a circuit board substrate. A bare substrate 40 for forming a circuit board according to the method of the invention is shown in FIG. 2. FIG. 3 shows the same circuit board with a layer of the photo imagable resist 50 formed on top. According to an aspect of the invention, the substrate 40 may be formed from any of a variety of typical circuit board substrate materials, including: thermoset resins, thermoplastic resins, ceramics and combinations thereof. The wide variety of substrates is made possible by virtue of the fact that the plasma spraying process, to be described in greater detail below, does not significantly raise the temperature of the substrate during deposition of the metal. Accordingly, since the substrates typically used for circuit boards can withstand the 200° F. to 500° F. temperatures of the plasma spraying process, they may all be used for forming a circuit board according to the invention.

Returning to FIG. 3, the resist layer 50 is shown on substrate 40. Prior to applying the resist layer 50 to the substrate 40, and depending upon the properties of the material forming the substrate, the surface or surfaces which are to receive metallization patterns may need to be conditioned to provide better adhesion of both the photo imagable resist and the plasma sprayed metal. One way of conditioning the substrate surface to receive the plasma sprayed metal is to mechanically roughen the surface by means of grit blasting the surface with fine glass or plastic beads. The duration and other process parameters of the grit blasting process will vary depending on the composition of the substrate and its size. Such mechanical roughening may by used on conventional ceramic and laminated circuit boards. Conditioning of the substrate surface to receive metal and resist may also be carried out by chemical processes which raise the surface energy of the substrate surface. As one example of such a conditioning of the surface, a gas plasma process is applied to the substrate. In a typical such process, the substrate is placed in an evacuated chamber which is then filled with 80% molecular hydrogen ($H_2$) and 20% molecular nitrogen ($N_2$), at a pressure of 250 mtorr. An arc is then passed through the gas at 4,000 watts to ionize the gas. The plasma then interacts with the substrate surface to raise its activation energy. In the case of the substrate formed of PTFE, for example, fluorines on the material surface are replaced with amine groups, thus raising the activation energy and wettability of that surface. An alternative means for raising the activation energy of a substrate surface is treatment of that surface with an etchant. For example, for a substrate formed of PTFE a surface treatment of an etchant manufactured by Acton Technologies of Pittston, Pa. and marketed under the name FLUORO-ETCH is carried out. Any of these various steps for conditioning the substrate surface may be used to roughen or raise the surface energy of the surface of the substrate 40 and allow for adequate adhesion both of the photo imagable resist film as well as the metal layer to follow. Depending on the material forming the substrate, however, it is possible within the broadest scope of the invention to not condition the surface in this manner. That is the substrate may have surface characteristics such that it does not require conditioning for the adherence of metal and the adhesion-resistant material. When such substrates are used, the conditioning step just described may be omitted from the process.

Figure 4:
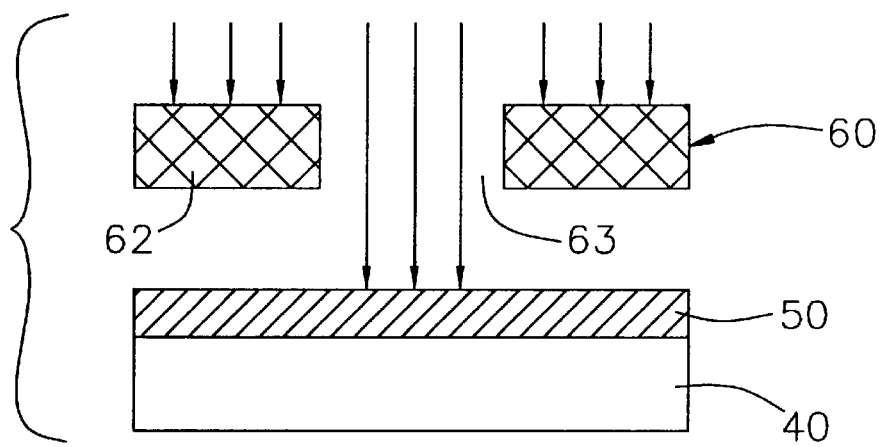
Figure 5:
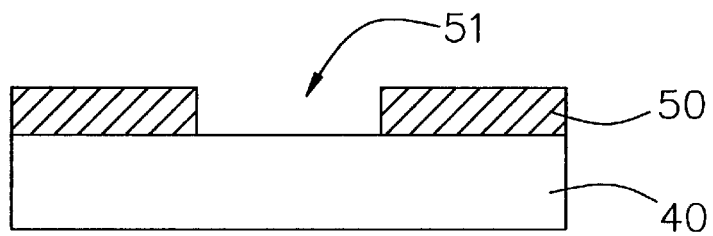

The next step in the method according to this embodiment of the invention is application of a layer of adhesion-resistant material in the form of photo imagable resist to the at least one surface resulting in the structure represented in FIG. 3 of the substrate 40 and the resist film 50. The resist is then patterned, as is illustrated in FIGS. 4 and 5. Since the resist is photo imagable, an imaging sheet 60 (also known as a photo-mask) may be put in place over the resist layer 50. As will be appreciated by one skilled in the art the imaging sheet will be comprised of a transparent region 62 and an opaque region 63. Typically, the opaque region 63 will correspond to the metalization pattern desired to be formed on the substrate 40. That is, the opaque regions will have the same pattern as is desired for the metalization. As will also be appreciated by one of skill in the art, other types of resist may also be used which would require the opaque regions to be the negative of the desired metallization pattern. Returning to FIG. 4, when electromagnetic radiation is directed through the photo mask and on the resist layer 50, only the areas on the substrate 40 where metalization is not desired will be exposed to that radiation, which is typically in the UV range for this type of photo imagable resist.

Following the imaging step, the substrate and resist layer are then developed by exposing the board to a developer solution which is typically a 1% $K_2CO_3$ aqueous solution. The developer removes the areas of the resist film 50 that were not exposed to the UV radiation because of the presence of the photo mask. Thus, once the resist in the unexposed areas is removed by the developer, the structure shown in FIG. 5 results. That is, the substrate 40 includes resist layer 50, but which resist layer 50 includes openings 51 where metalization patterning for the final circuit is desired. According to the invention, then, the layer of adhesion-resistant material has been patterned to expose areas of the circuit board to be coated with metal, which exposed areas have either been conditioned for receiving plasma sprayed metal or which are formed of a material to which metal will adhere, without conditioning.

Figure 6:
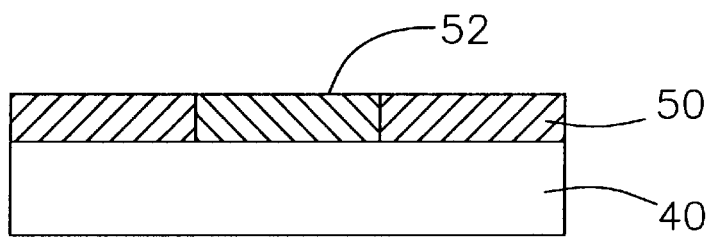

The next step in forming the printed circuit board according to the method of the invention is plasma spraying the surface or surfaces of the substrate that have been prepared and/or conditioned according to the above-described process steps. The structure resulting from this step is shown in FIG. 6 where the void 51 from FIG. 5 is now filled with copper or other metal 52 resulting from the plasma spraying process. It should be noted that the resist film 50, following the plasma spray process, does not have any metal deposited thereon. As explained before, this is because the resist is an adhesion-resistant material that presents a smooth and glossy surface that is unacceptable for adhesion of plasma sprayed metal. By contrast, the portion of the substrate 40 corresponding to the void 51 (FIG. 5) has illustratively been conditioned by the earlier-described conditioning step (if such a step is necessary), and is thus suitable for adhering of the metal film deposited by the plasma spray process.

Plasma spray coatings, advantageously used in the inventive method, are created by injecting powders of the desired deposition material (in this case copper or other metal) into the high temperature, high speed flame of a plasma gun. The plasma is typically created by ionizing an inert gas with a high energy direct current arc, typically powered from 20 KW to 100 KW. The plasma generated in this fashion approaches 27,0000° F. and may possess velocity up to Mach 2. The coating materials are injected into the plasma center and are thus melted or softened and propelled to a high speed toward a substrate. The substrates to be sprayed are located externally to the plasma gun, typically in a room or chamber having a nitrogen atmosphere. The plasma gun is effectively rastered horizontally and indexed vertically across the surface of the substrate or substrates being coated, and a layered build up forms of the coating to a controlled thickness.

The coating deposited by the plasma spray process can be as thin as 1 mil, although the preferred thickness according to the invention is approximately 1.5 mils. Despite the fact that the coating materials are subjected to very high temperatures in the plasma, the substrate remains relatively cool, with substrate temperatures generally remaining between 200° F. and 500° F. Accordingly, a variety of substrate materials may be used in the method according to the present invention. It is believed that the metal deposited on the substrate surface by the plasma spray process has an improved contact with the substrate surface, as compared to typical electroplating or sputtering of the surface with metal. Furthermore, because the temperature of the deposited coating is kept low, thermal distortion and undesirable oxidation of the metal are also avoided. Further still, the plasma spraying technique allows large volumes of substrates to be processed simultaneously. A quantity of substrates may be arranged on a panel, and the panel placed in the path to be covered by the rastering plasma gun.

The plasma spray process has the distinct advantage of generating very little waste. Most of the metal adheres to the substrates. The over sprayed metal can be collected and reprocessed for later plasma spraying. The waste generation of this process is particularly insignificant when compared to the conventional technique for forming circuit boards by plating an entire substrate surface, and then employing waste-intensive wet chemistry to mask and etch the surface to form the metallization pattern. At present, the preferred plasma spraying step is that performed by Thermal Spray Technologies of Sun Prairie, Wis.

Figure 7:
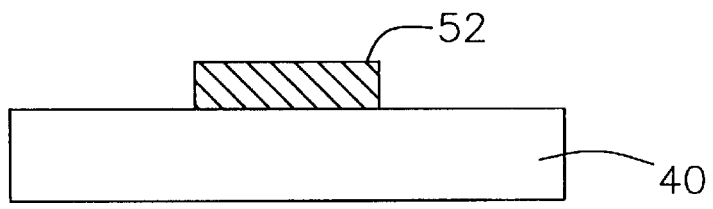

Following the plasma spray step, in which copper or other metal is deposited in the desired metalization pattern, the resist layer 50 is stripped from the surface of the substrate 40, thus leaving only the desired metalization as in FIG. 7. The stripper for the photo resist according to this embodiment of the invention has an inorganic base and includes an aliphatic amine, and glycol ether. As a result of these simple process steps, a circuit board is formed with the desired metalization pattern, but without undue generation of hazardous chemical wastes.

While use of a resist in combination with roughening or activating the substrate, as described above, is the preferred method for preparing the substrate surface with a pattern including selected areas for receiving metal, other techniques are also possible. For example, in the case of a smooth and low surface energy substrate such as PTFE, the surface may be conditioned only where metal is desired with the remaining surface being unaffected. To achieve this, the substrate surface would be coated with a patternable film that would only allow a surface conditioning agent such as an etchant or gas plasma to attack the portions of the substrate surface where a metalization pattern was desired. After this layer was removed, the substrate could then be subjected to plasma spraying. The plasma sprayed metal would only stick to the selectively conditioned areas of the substrate since the remaining area would still be "virgin", low surface energy PTFE. For performing this embodiment of the method of the invention, the etchant for conditioning the PTFE surface would preferably be the FLUORO-ETCH solution previously referred to, although a gas plasma process could also be used.

Regardless of which of these methods is used for preparing the substrate surface with a pattern included selected areas for receiving plasma sprayed metal in the desired metalization pattern, a circuit board like that shown in FIG. 1 results. Following formation of the circuit board in this fashion, the exposed copper areas (i.e. the metalization pattern) are preferably cleaned in a 5% sulfuric acid wash and rinsed with water. Alternatively, the metal surfaces may be processed with a light micro-etch. To protect the copper or other metal from oxidation and to prepare the circuit board for further processing, the exposed copper may then be silk screened with a solder mask using the so-called SMOBC (solder mask over bare copper) technique and then further processed by immersion in molten solder and/or hot air solder leveling. The waste generated by such finishing steps are minimal in comparison to those generated by conventional mask and etch wet chemistry processes. The completed circuit board may then be populated with components or bonded together with other circuit boards to form a multi-layered circuit board.

The method according to the invention may also be advantageously used for plated through hole ("PTH") formation. PTH's may be desirable for a variety of reasons, and are especially important in forming multi-layer circuit boards, or circuit boards bonded to a conductive metal ground plane and/or heat sink. A variety of techniques are presently used for forming PTH's, with electroless plating being the most common. As with conventional circuit board formation techniques, the existing techniques for forming PTH's generate significant hazardous waste, and include multiple process steps typically performed in coordination with the other process steps conventionally used for forming printed circuit boards.

Figure 8:
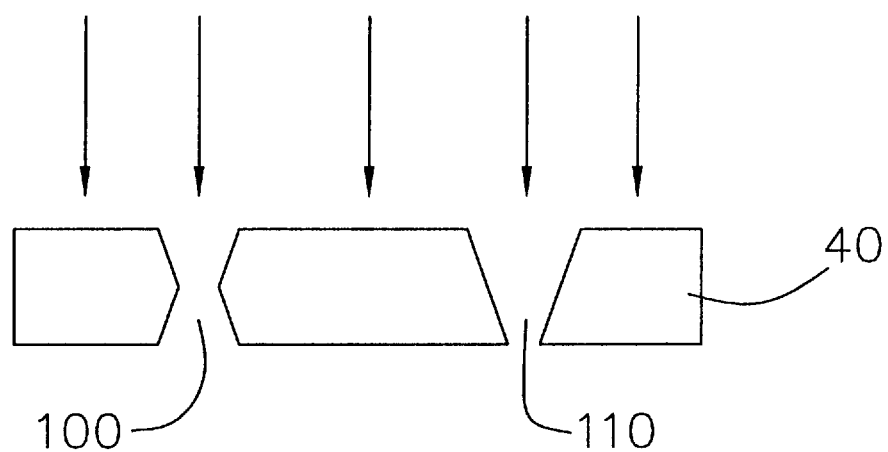
FIG. 8 is a sectional representation of a circuit board including plated through holes according to a further aspect of the invention.

According to the present invention, PTH's are easily formed by first forming openings in the circuit board substrate, the sidewalls of which openings will be coated with plasma-sprayed metal to form the PTH's. These surfaces are then conditioned for receiving metal either by a mechanical roughening process or a chemical process for raising the surface energy as previously described, and metal is then plasma sprayed on to the substrate to coat the surfaces of the openings and form the PTH's. In order for this technique to be effective, the substrate openings which will form the PTH's must have at least one angled sidewall, in distinction to the typically straight sidewall of conventional PTH's. The term "sidewall" is intended to encompass the interior geometric surface of a PTH. For example, in conventional "straight" PTH's, the sidewall forms a cylindrical surface. Two examples of an opening including at least one angled sidewall according to the present invention are shown in FIG. 8. Substrate opening 100 in FIG. 8 has an hour-glass configuration with two conical and thus angled sidewalls. That is, the interior surface of each half of the hourglass is tapered from the vertical. Alternatively, opening 110 is a frusto-conical opening including an angled sidewall that tapers from the vertical.

The openings forming the PTH's are required to include an angled sidewall because of the nature of the plasma spraying process by which the metal is deposited on the sidewall. As represented in FIG. 8 by the vertical arrows, a substrate being subjected to plasma spraying is impinged upon by the metal spray in the direction perpendicular to the plane of the substrate (the plasma spray is in the plane of the page in the sense of FIG. 8). The sidewall or walls forming the substrate opening 100, 110 must thus have some non-vertical or horizontal extent in order for the perpendicularly-approaching metal particles from the plasma spray to contact and adhere to those surfaces. If vertical sidewall openings were used, the plasma sprayed metal would simply pass through the through holes.

We have found that the sidewalls forming the openings 100, 110 in the substrate must be angled at least 40° from the vertical in order to effectively receive plasma sprayed metal directed at the surface of the substrate. The so-called "angle from the vertical" is shown in FIG. 8 at 120. Different techniques could be employed for forming the substrate openings 100, 110 according to the invention. For example if the substrate is injection-molded, the mold would include projections in the desired shape of the substrate openings. Alternatively, a solid substrate could be drilled to obtain the desired substrate opening configuration. Although two different types of openings 100, 110 have been illustrated, the preferred opening is the so-called "hour glass" configuration 100. First of all, the hour glass configuration may easily be formed in a solid substrate by drilling a substrate from the top and from the bottom to form the two halves of the hour glass. Further, the hour glass design takes up a smaller surface area on the substrate for a given sidewall angle. This is due to the fact that each angled sidewall in the hour glass configuration only extends half the thickness of the substrate as opposed to the full thickness of the substrate as in the frusto-conical opening 110. The hour glass configuration is limited, however, by virtue of the fact that both sides of the substrate must be plasma sprayed in order to properly coat the surfaces of the hour glass opening 100.

Following formation of the substrate openings 100, 110 including at least one angled sidewall, the surfaces of these openings must be conditioned for receiving metal. As is described in the circuit board formation method, above, such conditioning may be performed by a variety of means, including grit-blasting, a gas plasma process, or FLUORO-ETCH in the case of PTFE. Such treatment of the surfaces of the openings 100, 110 condition the surfaces so that plasma sprayed metal can contact and adhere to these surfaces during deposition. Following such conditioning, the openings are then subjected to the plasma spray process for coating of their interior surfaces. Of course, formation of the PTH's according to the invention may be integrated with the circuit board formation technique described above. In that case, the areas of the substrate corresponding to the PTH's would not be coated with resist during the plasma spray processing step.

There has thus been disclosed a simple method for forming printed circuit boards, that leads to reduced generation of hazardous wastes. Moreover, the simpler formation process may be applied to a variety of substrates since only a narrow range of processing temperatures are used. Further still, the invention also encompasses easily-formed plated through holes, having a novel configuration of angled sidewalls.

What is claimed is:

1. A method for forming a printed circuit board, comprising:

a) preparing at least one surface of a substrate with a pattern including selected areas for receiving copper and non-selected areas to which copper will not adhere, the non-selected areas being coated with a layer of adhesion-resistant material having a surface which is smooth/glossy such that copper does not adhere thereto, the pattern being formed by selectively removing only said adhesion-resistant material, the layer of said adhesion-resistant material being sufficiently thin that the selected and non-selected areas are substantially coplanar without any grooves or ridges defining the pattern; and thereafter b) plasma spraying the at least one surface with copper to coat the selected areas with copper while the non-selected areas remain substantially free of copper.

2. The method of claim 1, wherein the step of preparing at least one surface of a substrate with a pattern including selected areas for receiving copper comprises conditioning the substrate surface to receive copper and the adhesion-resistant material, followed by applying then patterning the layer of adhesion-resistant material to form the selected and non-selected areas.

* * * * *